United States Patent
Guettaf

(10) Patent No.: US 7,395,468 B2
(45) Date of Patent: Jul. 1, 2008

(54) METHODS FOR DEBUGGING SCAN TESTING FAILURES OF INTEGRATED CIRCUITS

(75) Inventor: Amar Guettaf, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 279 days.

(21) Appl. No.: 10/806,093

(22) Filed: Mar. 23, 2004

(65) Prior Publication Data

US 2005/0216805 A1    Sep. 29, 2005

(51) Int. Cl.
    *G01R 31/28* (2006.01)
(52) U.S. Cl. .................... 714/726; 714/729
(58) Field of Classification Search ............... None
    See application file for complete search history.

(56) References Cited

U.S. PATENT DOCUMENTS

| | | | |
|---|---|---|---|
| 4,493,077 A | | 1/1985 | Agrawal et al. |
| 4,727,545 A | | 2/1988 | Glackemeyer et al. |
| 5,210,486 A | * | 5/1993 | Wilson et al. ............ 324/537 |
| 5,235,600 A | | 8/1993 | Edwards |
| 5,278,842 A | | 1/1994 | Berry et al. |
| 5,386,423 A | * | 1/1995 | Koo et al. ................ 714/726 |
| 5,491,700 A | * | 2/1996 | Wright et al. ............ 714/759 |
| 5,515,384 A | | 5/1996 | Horton |
| 5,541,940 A | * | 7/1996 | Akita ..................... 714/800 |
| 5,621,651 A | | 4/1997 | Swoboda |
| 5,663,967 A | * | 9/1997 | Lindberg et al. .......... 714/737 |
| 5,812,562 A | | 9/1998 | Baeg |
| 5,859,442 A | | 1/1999 | Manning |
| 5,905,855 A | * | 5/1999 | Klaiber et al. ............ 714/31 |
| 5,909,451 A | | 6/1999 | Lach et al. |
| 6,199,182 B1 | | 3/2001 | Whetsel |
| 6,260,166 B1 | * | 7/2001 | Bhavsar et al. .......... 714/727 |
| 6,378,093 B1 | | 4/2002 | Whetsel |
| 6,452,435 B1 | | 9/2002 | Skergan et al. |
| 6,539,497 B2 | | 3/2003 | Swoboda et al. |
| 6,646,460 B2 | | 11/2003 | Whetsel |
| 6,760,866 B2 | | 7/2004 | Swoboda et al. |

(Continued)

OTHER PUBLICATIONS

U.S. Appl. No. 10/950,637, entitled "Methods and Computer Program Products for Debugging clock-Related Scan Testing Failures of Integrated Circuits," filed Sep. 28, 2004.

(Continued)

*Primary Examiner*—Shelly Chase
*Assistant Examiner*—Steven D Radosevich
(74) *Attorney, Agent, or Firm*—Sterne Kessler Goldstein & Fox, P.L.L.C.

(57) ABSTRACT

The present invention is directed to a method for debugging scan testing failures of integrated circuits. The method includes identifying a bad scan path among a set of scan paths and segmenting the bad scan path into two segments. Once the bad scan path is segmented into two segments, scan tests are run to determine whether the source of errors is near the segment point. If the number of errors generated is below a threshold, the specific location of errors can be identified by tracing the errors either manually or automatically through an automated testing unit. If the source of errors is not near the segment point, the segment point is shifted based on an analysis of the errors on the good and bad scan paths. Additional scan tests are then run and the method repeated until the location of the source of errors is found.

26 Claims, 6 Drawing Sheets

U.S. PATENT DOCUMENTS

| | | |
|---|---|---|
| 6,763,485 B2 * | 7/2004 | Whetsel ...................... 714/726 |
| 6,861,867 B2 | 3/2005 | West et al. |
| 6,915,494 B2 | 7/2005 | Shigeta |
| 6,978,416 B2 * | 12/2005 | Widmer ...................... 714/800 |
| 6,999,386 B2 * | 2/2006 | Sugimoto et al. ........ 369/30.22 |
| 2003/0208710 A1 * | 11/2003 | Martin-de-Nicolas et al. .... 714/736 |
| 2004/0123222 A1 * | 6/2004 | Widmer ...................... 714/779 |
| 2005/0166108 A1 * | 7/2005 | Huisman et al. ............ 714/726 |

OTHER PUBLICATIONS

Office Action for U.S. Appl. No. 10/950,637, dated Sep. 27, 2006, 9 pages.

Office Action for U.S. Appl. No. 10/950,637, dated Apr. 11, 2007, 6 pages.

* cited by examiner

310 — Scan Path Test Output: 0 1 1 0 0 1 1 0 1 0

320 — Scan Path Test Reference Pattern: 0 1 0 1 0 X 0 0 X X 1 0

330 — Scan Path Test Path Result: C C C E C C C X E E X X C C

METHODS FOR DEBUGGING SCAN TESTING FAILURES OF INTEGRATED CIRCUITS

BACKGROUND OF THE INVENTION

1. Field of the Invention

The present invention relates to integrated circuits, and more particularly, to scan testing of integrated circuits.

2. Background of Invention

Effective testing of integrated circuits significantly enhances the ability of integrated circuit developers and manufacturers to provide reliable devices. Various techniques have been employed to test integrated circuits during the manufacturing process. One such technique that is commonly known, and has been used within the industry for over twenty years is scan testing.

Scan testing provides an efficient approach to testing the structural integrity of devices, such as flip-flops, within a complex integrated circuit. Scan testing does not test integrated circuit-level functionality. Rather, test personnel use scan testing to confirm that individual flip-flops within an integrated circuit function properly. The sheer number of flip-flops within an integrated circuit, which is often greater than a million, presents a daunting challenge for testing. Scan testing addresses this challenge through the use of automated test units that provide test vectors to scan paths including thousands of flip-flops within integrated circuits that have been designed to support scan testing.

Typically, complex integrated circuits are designed and implemented as a series of interconnected functional blocks, each of which can be tested independently. Devices, such as flip-flops, within these functional blocks can be designed, such that they can be connected together in a scan path to support scan testing. Flip-flops and other elements within a scan path include, in addition to inputs and outputs used for normal operation, two inputs associated with the scan testing capability. These include a scan input (SI) and a scan enable (SE) input. Flip-flops within a scan path have their output connected to the SI input of a subsequent flip-flop. The first flip-flop within a scan path receives its input from an automated test unit through a test access port on the chip. The last flip-flop within a scan path provides its output to the automated test unit through a test access port. Many scan paths can exist within a single integrated circuit.

While scan testing provides significant benefits, a shortcoming exists related to efficiently debugging a scan testing failure to identify the source or sources of the failure. Identifying the source of a scan path failure can be quite difficult. A typical integrated circuit can include many scan paths with each scan path including as many as 10,000 flip-flops. Furthermore, when there is a failure point within a particular scan path, errors will be generated on the output of that scan path, but also can be propagated to other scan paths through logical and physical interconnections. Thus, scan paths that are good (i.e., do not have failure points within their path) can also generate unexpected results.

A wide variety of sources for errors can exist. For example, errors can be caused by a bad layout of the integrated circuit in which the circuit can function normally at a particularly frequency, temperature or voltage, but when these factors are changed errors can occur. In another example, a bad design, such as using a latch instead of a flip-flop, can cause errors. Yet another example, could be that the mask used to fabricate the integrated circuit was defective leading to broken connections between flip-flops or poorly performing flip-flops. Finally, a wrong wiring diagram can be used by the tester. In this case, a tester might perceive errors, which are not actually errors. Given the large number of scan paths, the large number of flip-flops in a scan path, the interrelationship between scan paths and the many possible sources of errors debugging scan test failures can take days or even months.

What is needed is a method for efficiently debugging scan testing failures to identify the source of the failure.

SUMMARY OF THE INVENTION

The present invention is directed to a method for debugging scan testing failures of integrated circuits. The method includes identifying a bad scan path among a set of scan paths and segmenting the bad scan path into two segments. Once the bad scan path is segmented into two segments, scan tests are run to determine whether the source of errors is near the segment point. If the number of errors generated is below a threshold, the specific location of errors can be identified by tracing the errors either manually or automatically through an automated testing unit. If the source of errors is not near the segment point, the segment point is shifted based on an analysis of the errors on the good and bad scan paths. Additional scan tests are then run and the method repeated until the location of the source of errors is found. In an alternative embodiment, the method can be applied to identify the location of the sources of errors when more than one bad scan path exists.

A benefit of the invention is that the time to debug scan test failures can be dramatically reduced, thereby reducing integrated chip production costs and streamlining integrated circuit manufacturing.

Further embodiments, features, and advantages of the invention, as well as the structure and operation of the various embodiments of the invention are described in detail below with reference to accompanying drawings.

BRIEF DESCRIPTION OF THE FIGURES

The invention is described with reference to the accompanying drawings. In the drawings, like reference numbers indicate identical or functionally similar elements. The drawing in which an element first appears is indicated by the left-most digit in the corresponding reference number.

DETAILED DESCRIPTION OF THE INVENTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the invention would be of significant utility.

Figure 1:
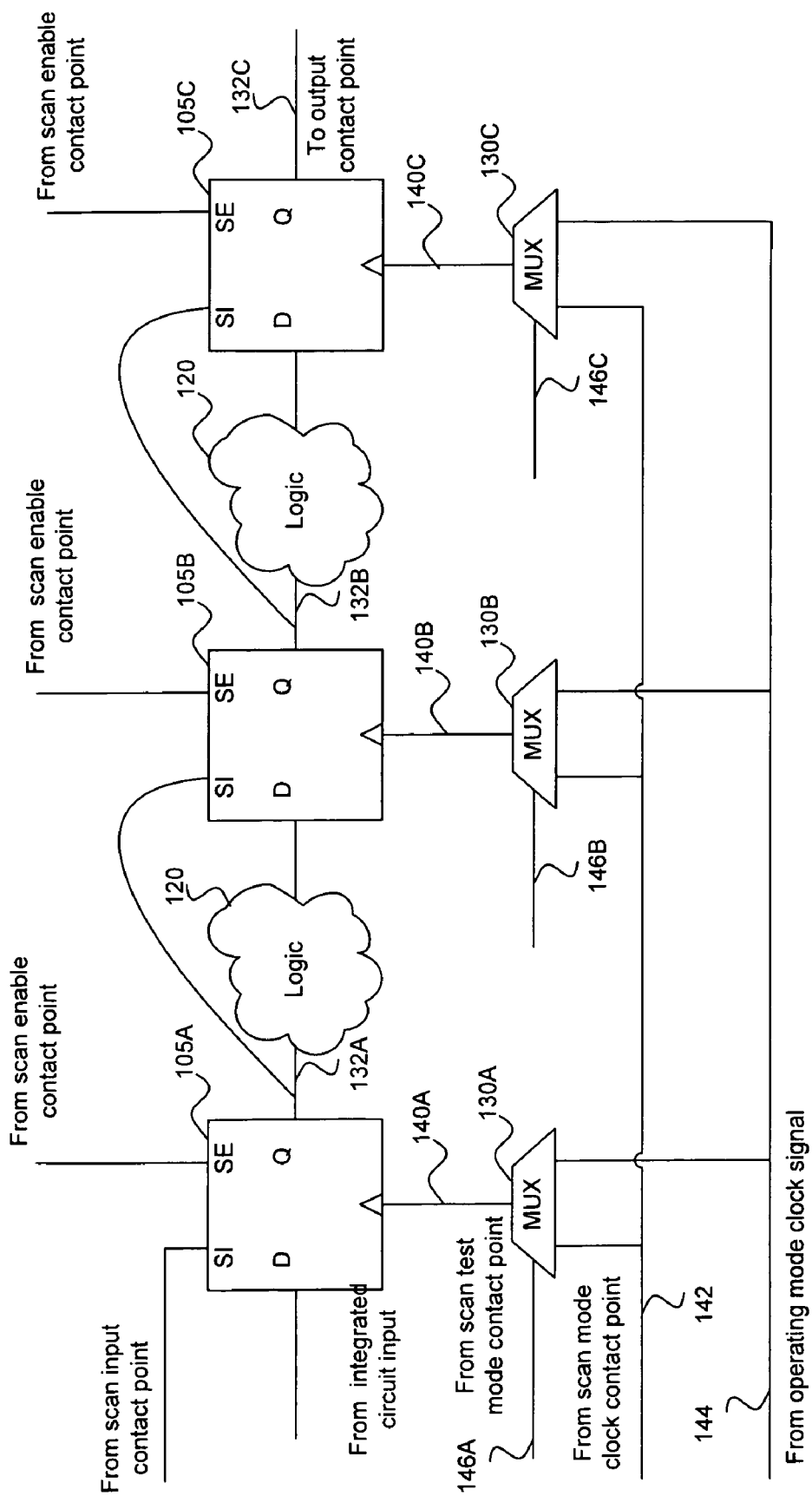
FIG. 1 is a diagram of a truncated scan path.

FIG. 1 illustrates an example of a truncated scan path within an integrated circuit. The scan path includes flip-flop 105A, flip-flop 105B, and flip-flop 105C. Flip-flop 105A represents the first flip-flop in the scan path. An SI input on flip-flop 105A is coupled to a scan input contact point. The scan input contact point provides an interface to an automated testing unit that allows test patterns to be inputted. An SE input on flip-flop 105A is coupled to a scan enable contact point.

Two modes exist within scan testing: shift mode and capture mode. In shift mode, a flip-flop will process inputs received on the SI input. The scan enable contact point provides an interface to an automated testing unit that allows the test unit to provide a signal that places a flip-flop into shift mode. In capture mode, a flip-flop will process inputs received on the D input, as would be the case in normal operating mode. In this case, a low signal is typically applied to the SE input to enter capture mode.

Output 132 of each flip-flop in a scan path is coupled to an SI input of the subsequent flip-flop in a scan path. For example, output 132A of flip-flop 105A is coupled to the SI input of flip-flop 105B. The output 132B of flip-flop 105B is coupled to the SI input of flip-flop 105C. As flip-flop 105C represents the last flip-flop in the scan path, its output 132C is coupled to an output contact point that can be coupled to the automated test unit to enable the test unit to monitor the output patterns during testing. Additionally, outputs 132 from flip-flops 105 are connected to other devices (e.g., logic 120) for normal operation—non-scan test mode—supporting integrated circuit logic and operations.

Clock inputs 140 for each of flip-flops 105 are received from a multiplexer, such as multiplexers 130A, 130B, and 130C. Multiplexers 130 are coupled to clock signal inputs 142 and 144. Clock signal 144 is used for normal operation. Clock signal 142 is used in scan testing mode. In addition, as discussed further below, memory and other functional components contained within logic 120 will receive a clock signal. Each of multiplexers 130A, 130B, and 130C have a control input 146 connected to a scan test mode contact point. When scan testing is to take place, an automated test unit controls multiplexers 130A, 130B, and 130C via control inputs 146 to connect the scan testing mode clock signal 142 to the flip-flop clock inputs 140.

When scan testing takes place, normal operation is suspended and each flip-flop, such as flip-flops 105, within a scan path under test is instructed through the SE input to enter scan test shift mode. For example, a high signal may be placed on this input to enter scan test shift mode. Once the flip-flop, such as flip-flops 105, is in scan test shift mode mode, a test input signal will be inputted from a test vector to the SI input. One or more scan test clock signals, such as clock signal 142, can then be provided to the flip-flops under test to toggle the flip-flops and to clock out a scan test output.

Figure 2:
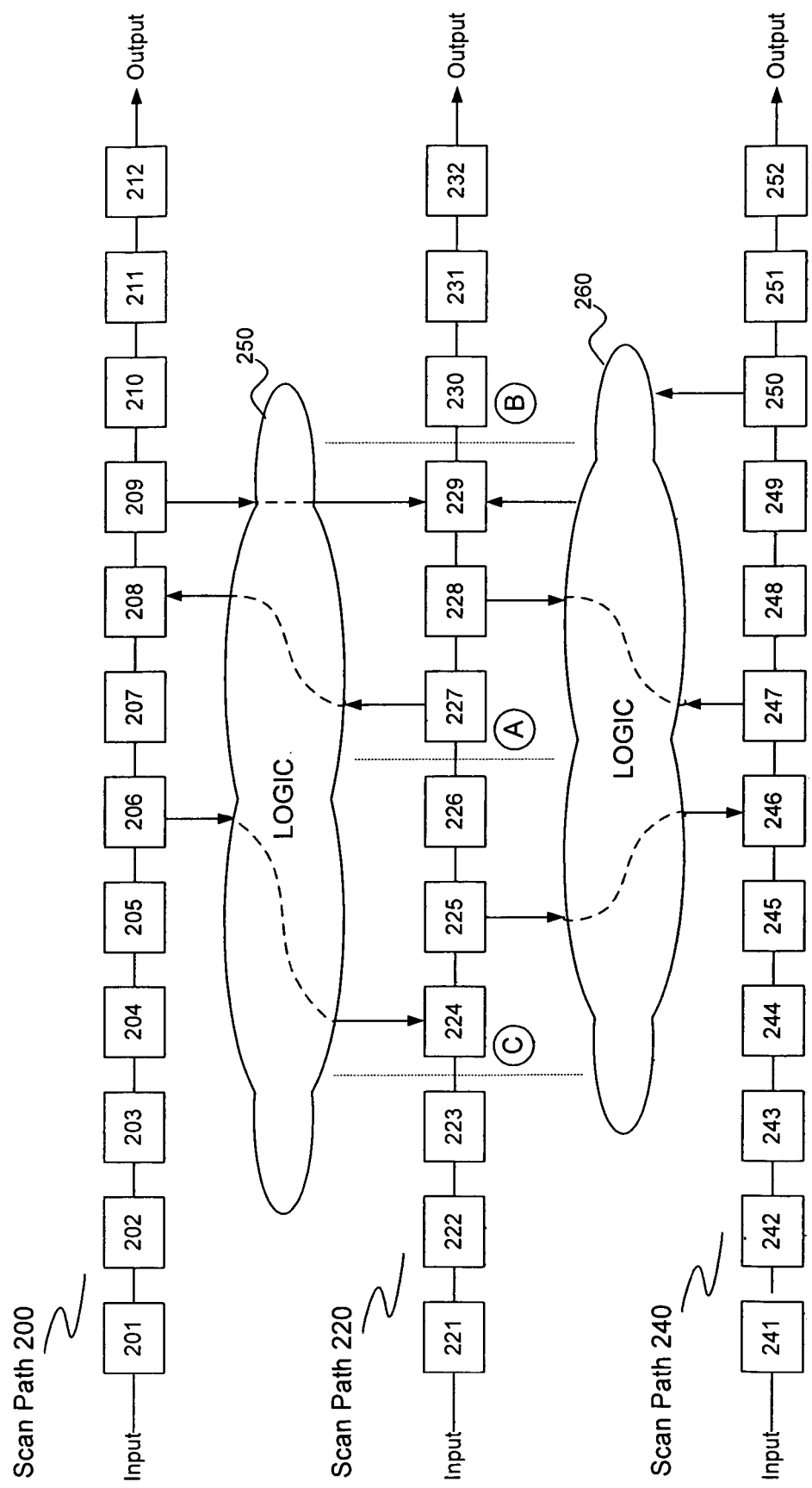
FIG. 2 is a diagram of three scan paths.

FIG. 2 provides a diagram of three scan paths that represent a small portion of scan paths that might exist in an actual integrated circuit. These scan paths shall be referred to with reference to the debugging method illustrated in FIG. 4 and described below. The three scan paths are scan path 200, scan path 220 and scan path 240. As discussed above each scan path can include, for example, as many as 10,000 flip-flops. For ease of illustration, scan paths 200, 220 and 240 represent only a small number of scan paths that can be included in an integrated circuit and each contain only twelve flip-flops.

Scan path 200 includes flip-flops 201 through 212, scan path 220 includes flip-flops 221 through 232, and scan path 240 includes flip-flops 241 through 252. The flip-flops of scan paths 200, 220 and 240 are logically related through interconnections within the integrated circuit logic. The example of FIG. 2 contains logic 250 and logic 260, which can contain memory circuits, latches and other types of devices.

Scan paths 200 and 220 are coupled to each other through logic 250. Specifically, the output of flip-flop 206 in scan path 200 is coupled through logic 250 to the SI input of flip-flop 224 within scan path 220. The output of flip-flop 209 in scan path 200 is coupled through logic 250 to the SI input of flip-flop 229 within scan path 220. The SI input of flip-flop 208 is coupled through logic 250 to the output of flip-flop 227 within scan path 224.

Similarly, scan paths 220 and 240 are coupled through logic 260. Specifically, the output of flip-flop 225 within scan path 220 is coupled through logic 260 to the SI input of flip-flop 246 within scan path 240. The SI input of flip-flop 228 within scan path 220 is coupled to the output of flip-flop 247 within scan path 240.

Figure 3A:
FIG. 3 is a diagram of the test output of a scan path.

FIG. 3A provides a diagram of scan test output 310 that can be associated with any one of the three scan paths illustrated in FIG. 2. The scan test output 310 is generated by applying a test vector to a scan path and propagating that vector through the scan path by cycling the flip-flops. Scan test output 310 is received by an automated test unit connected to the output of the scan path. Scan test output 310 includes a series of ones and zeroes, and is:

011100111011

Figure 3B:
Figure 3B:

The automated test unit compares the received scan test output, for example, scan test output 310 to a reference test pattern, such as reference test pattern 320, which is illustrated in FIG. 3B. The reference test pattern represents the expected output from the scan path under test based on the specific test vector and tests being run. To assess whether the scan path passes the particular test, scan test output 310 is compared to reference test pattern 320. Reference test pattern 320 includes a series of ones, zeroes, and X's. The X's indicate that the test unit does not care whether the output is a one or a zero. An X may be part of a reference pattern where the input to a particular flip-flop is unreliable. Reference test pattern 320 is:

01010X00XX10

Scan test path output 310 is compared to scan path test reference 320 to generate scan path test result 330, which is illustrated in FIG. 3C. When the values in a particular slot within scan test path output 310 and scan path test reference pattern 320 are the same, a C is provided for that slot that indicates a correct result. When the values in a particular slot within scan test path output 310 and scan path test reference pattern 320 are different and the slot in scan path test reference pattern 320 does not contain an X, an E is provided for that slot to indicate that an error exists. When the scan path test reference pattern 320 contains an X in a particular slot, an X is provided for that slot to indicate that the value for scan path test output 310 for that slot is irrelevant. Based on these rules, scan test path output 310 can be compared to scan path test reference pattern 320 to provide scan path test result 330. Scan path test result 330 is:

CCECCXEEXXCC

The number of errors (represented by E's) in scan path test result 330 can then be compared to a scan path error threshold. If the number of errors exceeds that threshold, the scan path is presumed to be bad. Typically, the scan path error threshold will be zero. Additional scan tests will typically be conducted to isolate the presumed bad scan path to confirm that it is the bad scan path. These tests can typically involve comparison of the number of errors on a particular scan path compared to other scan paths, and isolation tests that can mask the impact of a presumed bad scan path to confirm that other scan paths are good (i.e., generate errors less than the scan path error threshold.) or determine that there are multiple scan paths that are bad.

Figure 4:
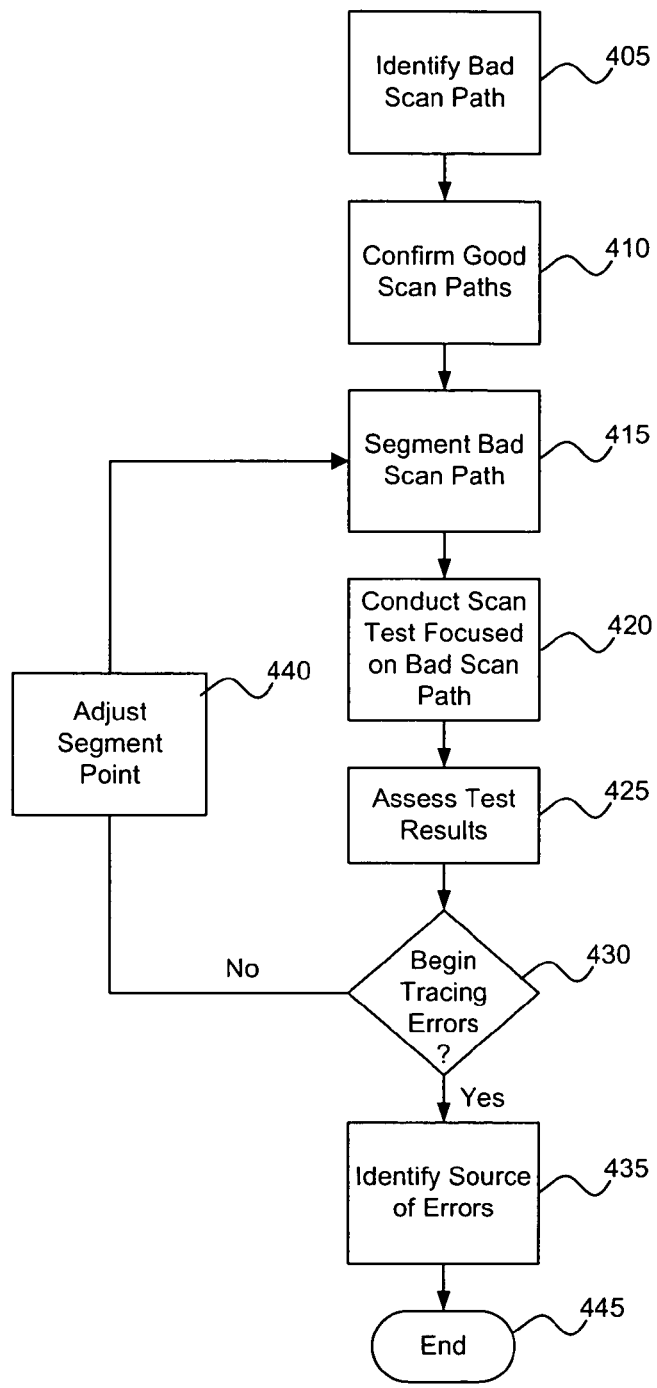
FIG. 4 is a flow chart of a method for debugging scan testing failures of an integrated circuit, according to an embodiment of the invention.

FIG. 4 provides a flow chart of method 400 for debugging scan testing failures of an integrated circuit, according to an embodiment of the invention. Method 400 is explained with reference to the scan paths in FIG. 2. References to these scan paths are for ease of illustration, and not intended to limit in any way the scope of method 400. Additionally, for the purpose of illustration, it can be assumed that scan path 220 is a bad scan path.

Method 400 begins in step 405. In step 405, a bad scan path is identified. The identification of a bad scan path occurs by running a series of scan tests in which different scan test patterns are loaded into each of the scan paths. In addition, the tester can vary voltages, clock frequencies and temperatures while loading the scan test patterns. Many approaches can be used to identify a bad scan test path, as will be known by individuals skilled in the relevant art. With reference to FIG. 2, in step 405 scan path 220 can be identified as the bad scan path.

In step 410, scan paths that are presumed good are confirmed. Scan paths that are presumed good are confirmed by masking the bad scan path that was identified in step 405. For example, scan path 220 can be masked while additional scan test patterns are loaded into scan paths 200 and 240 to confirm that they are good scan paths without any interaction with scan path 220, which is presumed to be bad. These tests are used to ensure that the proper test setup has been used, and that the only source or sources of errors are located in the scan path that is assumed to be bad. Method 400 proceeds to step 415.

In step 415, the bad scan path is segmented. In one embodiment, the initial segmentation of the bad scan path is to divide the bad scan path in half. For example, in scan path 220 the initial segment point would be point A in FIG. 2. Point A is between flip-flops 226 and 227, such that there are six flip-flops prior to point A and six flip-flops after point A. In alternative embodiments, different approaches to identifying a location for a segment point can be used. Such approaches are within the scope and spirit of the invention. Method 400 proceeds to step 420.

In step 420, scan tests are conducted that focus on the bad scan path. The segment point is assumed to be the point in the scan path that is the location for the source of errors. A series of scan tests are conducted to confirm whether the segment point is actually at the location that is the source of errors. If the segment point is not at the location of the source of errors, results of the scan tests in this step are used to move the segment point in a direction assumed to be closer to the location for the source of errors based on an analysis of the test results as discussed below.

Testing to assess the location of the segment point within the bad scan path is conducted as follows. When conducting the scan tests, all outputs from flip-flops in a bad scan path, such as scan path 220, that are before the segment point, such as point A, are assumed to be observed X's. In other words, test results for these flip-flops as observed by a tester are presumed unreliable since they must pass through the segment point, which is assumed to be the source of the errors. Because they are presumed unreliable, they are considered observed X's, or in other words, data that a tester does not care about. Nonetheless, the values driven by flip-flops before the segment point to other flip-flops are considered valid because these values do not propagate through the segment point. For example, a value driven from flip-flop 225 to flip-flop 246 in scan path 240 is assumed to be a good value because it does not pass through the segment point.

On the other hand, all observed outputs from flip-flops in a bad scan path, such as scan path 220, that are after the segment point are assumed to be valid data. The values driven by flip-flops following the segment point, however, are presumed to be unreliable because they are influenced by data that has passed through the segment point. These assumptions are incorporated into the test patterns that are used by the automated test unit to conduct the scan tests. Individuals skilled in the relevant art will know how to set up the test patterns within automated test units to reflect the above assumptions. Method 400 proceeds next to step 425.

In step 425, scan path test outputs are assessed. The scan test outputs from each of the scan paths are examined. For example, the outputs of scan path 200, scan path 220 and scan path 240 can be considered. Method 400 proceeds to step 430.

In step 430, a determination is made whether to begin tracing the source of errors based on the assessment of the scan path outputs done in step 425. A determination to begin tracing for errors is made when the number of errors on the presumed bad scan path are less than a bad path error threshold and the errors on the presumed good scan path are also less than a good path error threshold. The bad path error threshold and good path error threshold values are set depending on the method to be employed to trace errors. The bad path error threshold and the good path error threshold values can be equal, but are not required to be. If errors will be traced manually, then typically the thresholds will be set lower. If errors will be traced semi-automatically or automatically through the use of an automated testing unit, the threshold can be set higher.

The bad path error threshold will typically not be set to zero because even if the segment point is chosen after the source or sources of the errors, errors generated on a flip-flop within the bad scan path before the segment point can propagate to a flip-flop beyond the segment point through a logical relationship, resulting in errors within the output of the bad scan path. For example, in scan path 220 flip-flop 223 can have a logical relationship with flip-flop 230. In this case, if segment point A was chosen and the source of errors was to the left of point A, errors on the output of scan path 220 might still be received because of the logical relationship between flip-flop 223 and 230.

When a determination is made that tracing for errors should not begin, method 400 proceeds to step 440. In step 440 the segment point within the bad scan path, such as scan path 220, is adjusted. If the scan path 220 output contains a number of errors that exceeds a bad path error threshold amount, then the segment point is shifted to the right. In one embodiment, the shift is done by once again dividing the number of flip-flops between the current segment point and end of scan path 220 in half to determine the next segment point. For example, the segment point at Point A is shifted to a new segment point at Point B located between flip-flops 229 and 230 within scan path 220, such that three flip-flops are located between Point A and B, and three are located between Point B and the output of scan path 220.

If on the other hand, the scan path 220 output does not exceed the bad path error threshold amount, and the number of errors on good scan paths 200 and 240 exceed a good path error threshold amount, then the segment point is shifted to the left. In one embodiment, the shift is done by once again dividing the number of flip-flops between the start of the scan path and the current segment point in half to determine the next segment point. For example, the segment point at Point A is shifted to a new segment point at Point C located between flip-flops 223 and 224 within scan path 200, such that three flip-flops are located between Point A and C, and three are located between Point C and the input of scan path 220.

Once a new segment point is determined, method 400 proceeds back to step 415, and the bad scan test path is segmented based on the new segment point. Method 400 then proceeds to repeat steps 415 through 430 until a decision is made to begin tracing for errors.

When a determination is made to begin tracing the source of errors, method 400 proceeds to step 435. In step 435, the source or sources of errors within a bad scan path are identified. The identification of errors can take place either manually or automatically. Each of the observed errors on the bad scan path and the good scan path are traced back to the source of the error through use of the schematic for the integrated chip. Method 400 proceeds to step 445. Method 400 ends in step 445.

Figure 5:
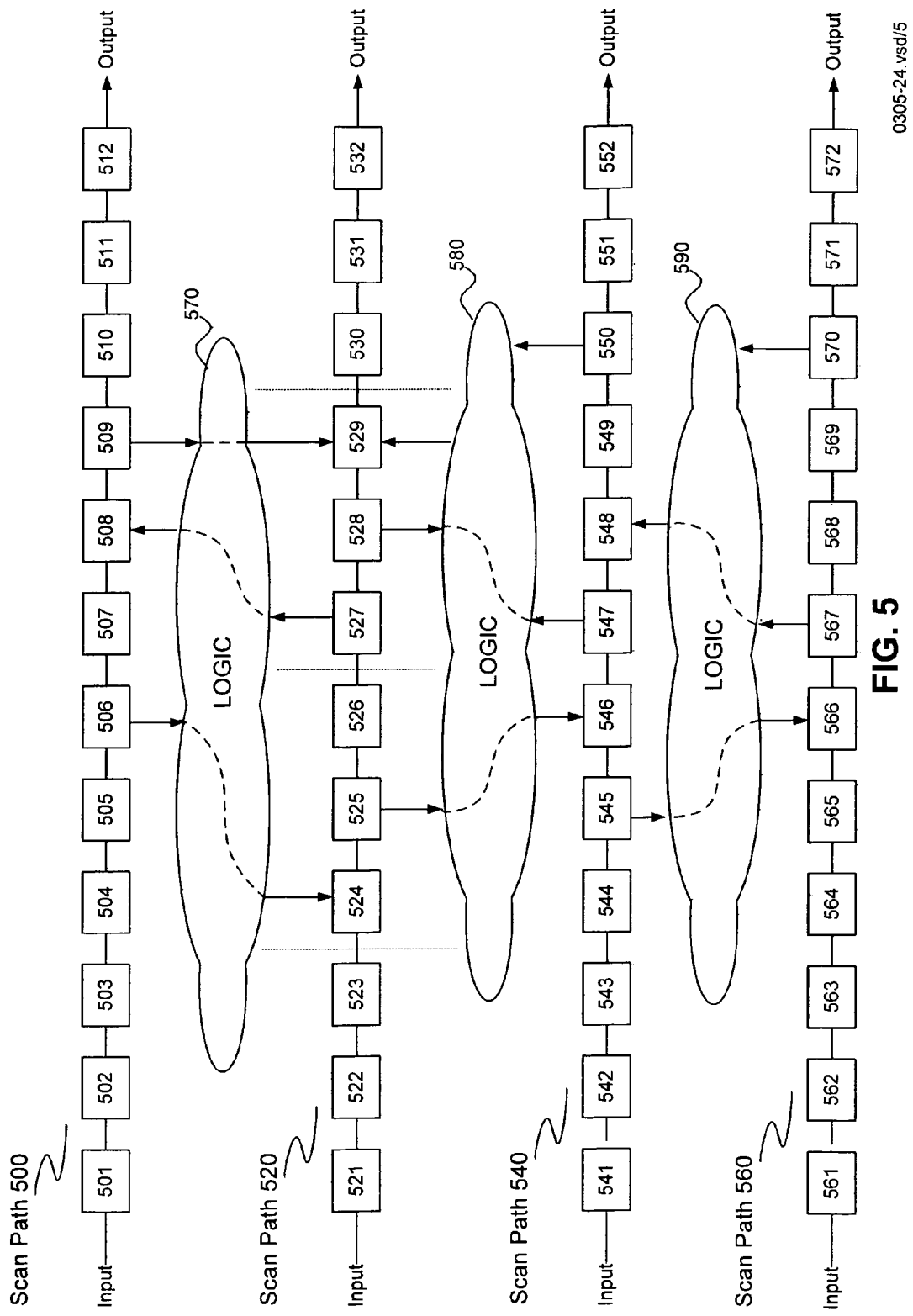
FIG. 5 is a diagram of four scan paths.

FIG. 5 provides a diagram of four scan paths that represent a small portion of scan paths that might exist in an actual integrated circuit. These scan paths shall be referred to with reference to the debugging method illustrated in FIG. 6 and described below. The four scan paths are scan path 500, scan path 520, scan path 540 and scan path 560. As discussed above each scan path can include as many as 10,000 flip-flops. For ease of illustration, scan paths 500, 520, 540 and 560 represent only a small number of scan paths that can be included in an integrated circuit and each contain only twelve flip-flops.

Scan path 500 includes flip-flops 501 through 512, scan path 520 includes flip-flops 521 through 532, scan path 540 includes flip-flops 541 through 552, and scan path 560 includes flip-flops 561 through 572. The flip-flops of scan paths 500, 520, 540, and 560 are logically related through interconnections within the integrated circuit logic. The example of FIG. 5 contains logic 570, 580, and 590, which can contain memory circuits, latches and other types of devices.

Scan paths 500 and 520 are coupled to each other through logic 570. Scan paths 520 and 540 are coupled to each other through logic 580. Scan paths 540 and 560 are coupled to each other through logic 590.

Figure 6:
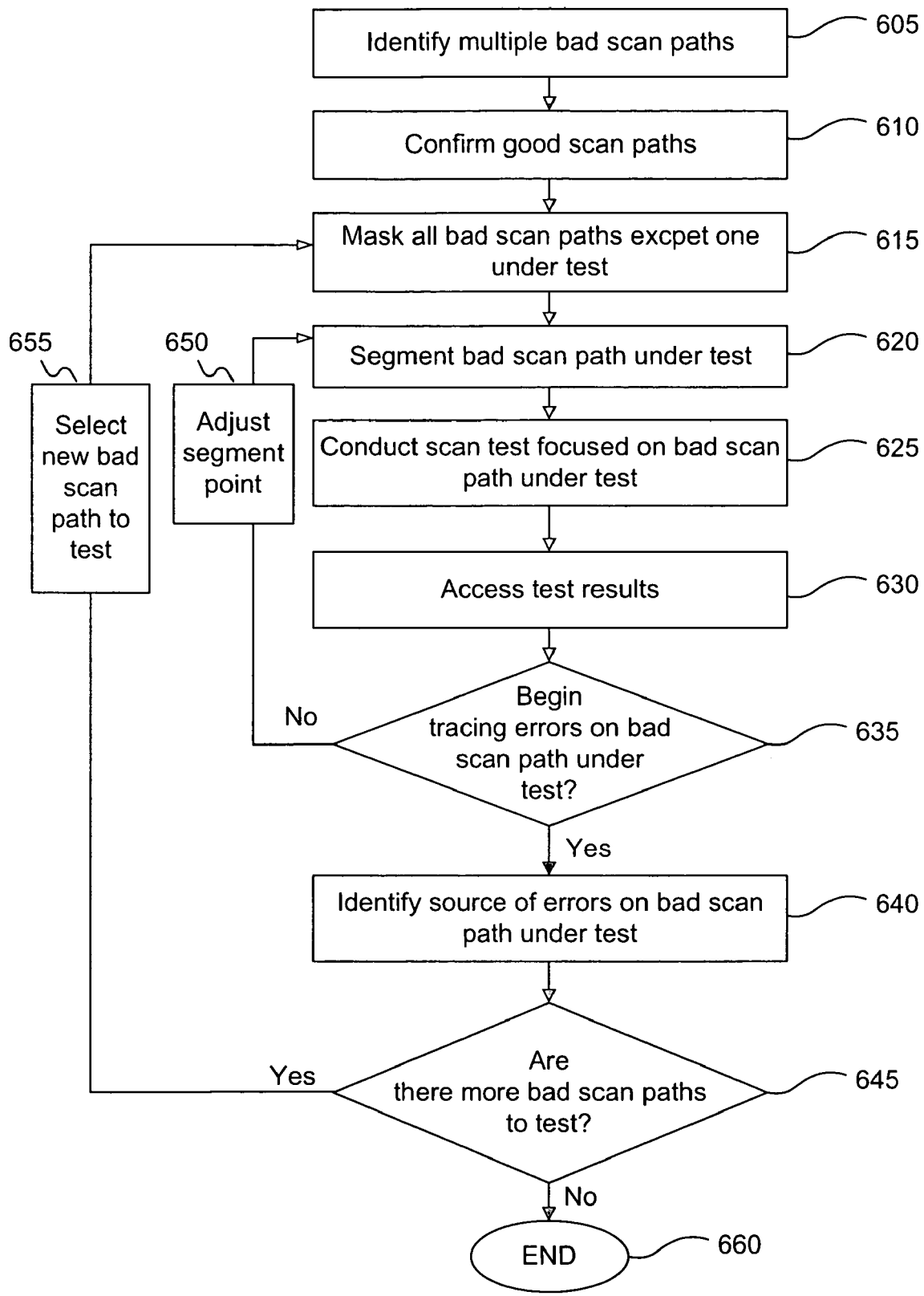
FIG. 6 is a flow chart of a method for debugging scan testing failures of an integrated circuit involving more than one bad scan path, according to an embodiment of the invention.

FIG. 6 provides a flow chart of method 600 for debugging scan testing failures of an integrated circuit, according to an embodiment of the invention. The difference between method 600 and method 400 is that method 600 addresses the situation in which there are more than one scan paths that are bad, while method 400 addressed the situation in which there was only one bad scan path. Method 600 is explained with reference to the scan paths in FIG. 6. References to these scan paths are for ease of illustration, and not intended to limit in any way the scope of method 600. Additionally, for the purpose of illustration, it can be assumed that scan path 520 and 540 are bad scan paths.

Method 600 begins in step 605. In step 605, more than one bad scan paths are identified. The identification of bad scan paths occurs by running a series of scan tests in which different scan test patterns are loaded into each of the scan paths. In addition, the tester can vary voltages, clock frequencies and temperatures while loading the scan test patterns. Many approaches can be used to identify a bad scan test path, as will be known by individuals skilled in the relevant art. With reference to FIG. 5, in step 605 scan paths 520 and 540 can be identified as the bad scan path.

In step 610, scan paths that are presumed good are confirmed. Scan paths that are presumed good are confirmed by masking the bad scan paths, such as scan paths 520 and 540 that were identified in step 405. For example, scan path 520 and 540 can be masked while additional scan test patterns are loaded into scan paths 500 and 560 to confirm that they are good scan paths without any interaction with scan paths 520 and 540, which are presumed to be bad. These tests are used to ensure that the proper test setup has been used, and that the only source or sources of errors are located in the scan path that is assumed to be bad. Method 600 proceeds to step 615.

In step 615 all bad scan paths except the one under test are masked. For example, scan path 540 can be masked while scan path 520 undergoes testing to identify the source of errors within that scan path.

In step 620, the bad scan path under test is segmented. In one embodiment, as was the case in Method 400, the initial segmentation of the bad scan path under test is to divide the bad scan path in half. In alternative embodiments, different approaches to identifying a location for a segment point can be used. Such approaches are within the scope and spirit of the invention. Method 600 proceeds to step 625.

In step 625, scan tests are conducted that focus on the bad scan path under test. As in Method 400, the segment point is assumed to be the point in the scan path that is the location for the source of errors. A series of scan tests are conducted to confirm whether the segment point is actually at the location that is the source of errors. If the segment point is not at the location of the source of errors, results of the scan tests in this step are used to move the segment point in a direction assumed to be closer to the location for the source of errors based on an analysis of the test results as discussed below.

Testing to assess the location of the segment point within the bad scan path is conducted as follows. When conducting the scan tests, all outputs from flip-flops in a bad scan path, such as scan path 520, that are before the segment point, such as point A, are assumed to be observed X's. In other words, test results for these flip-flops as observed by a tester are presumed unreliable since they must pass through the segment point, which is assumed to be the source of the errors. Because they are presumed unreliable, they are considered observed X's, or in other words, data that a tester does not care about. Nonetheless, the values driven by flip-flops before the segment point to other flip-flops are considered valid because these values do not propagate through the segment point.

On the other hand, all observed outputs from flip-flops in a bad scan path, such as scan path 520, that are after the segment point are assumed to be valid data. The values driven by flip-flops following the segment point, however, are presumed to be unreliable because they are influenced by data that has passed through the segment point. These assumptions are incorporated into the test patterns that are used by the automated test unit to conduct the scan tests. Individuals skilled in the relevant art will know how to set up the test patterns to reflect the above assumptions. Method 600 proceeds next to step 630.

In step 630, scan path test outputs are assessed. The scan test outputs from each of the scan paths are examined. For example, the outputs of scan path 600, scan path 620 and scan path 660 can be considered. Method 600 proceeds to step 635.

In step 635, a determination is made to whether to begin tracing the source of errors based on the assessment of the scan path outputs done in step 630. A determination to begin tracing for errors is made when the number of errors on the presumed bad scan path under test are less than a bad path error threshold and the errors on the presumed good scan paths are also less than a good path error threshold. The bad path error threshold and good path error threshold values are set depending on the method to be employed to trace errors. The bad path error threshold and the good path error threshold values can be equal, but are not required to be. If errors will be traced manually, then typically the thresholds will be set lower. If errors will be traced semi-automatically or automatically through the use of an automated testing unit, the threshold can be set higher.

As in Method 400, the bad path error threshold will typically not be set to zero because even if the segment point is chosen after the source or sources of the errors, errors generated on a flip-flop within the bad scan path before the segment point can propagate to a flip-flop beyond the segment point through a logical relationship, resulting in errors within the output of the bad scan path.

When a determination is made that tracing for errors should not begin, method 600 proceeds to step 650. In step 650 the segment point within the bad scan path under test, such as scan path 520, is adjusted. If the scan path 520 output contains a number of errors that exceeds a bad path error threshold amount, then the segment point is shifted to the right. In one embodiment, as in Method 400, the shift is done by once again dividing the number of flip-flops between the current segment point and end of scan path 520 in half to determine the next segment point.

If on the other hand, the scan path 520 output does not exceed the bad path error threshold amount, and the number of errors on good scan paths 500 and 560 exceed a good path error threshold amount, then the segment point is shifted to the left. In one embodiment, as in Method 400, the shift is done by once again dividing the number of flip-flops between the start of the scan path and the current segment point in half to determine the next segment point.

Once a new segment point is determined, method 600 proceeds back to step 620, and the bad scan test path under test is segmented based on the new segment point. Method 600 then proceeds to repeat steps 620 through 635 until a decision is made to begin tracing for errors.

When a determination is made to begin tracing the source of errors, method 600 proceeds to step 640. In step 640, the source or sources of errors within a bad scan path under test are identified. The identification of errors can take place either manually or automatically. Each of the observed errors on the bad scan path and the good scan path are traced back to the source of the error through use of the schematic for the integrated chip. Method 600 proceeds to step 645.

In step 645 a determination is made whether the sources of errors for all bad scan paths have been determined. For example, with reference to FIG. 5 and the assumption that both scan paths 520 and 540 are bad, once the source of errors for scan path 520 are determined, Method 600 would proceed to step 655. In step 655, a new bad scan path to test is selected, which in this example would be scan path 540. Method 600 then proceeds to step 615. Method 600 would repeat steps 615 through 645 until the sources of errors for all bad scan paths are determined. Once the source of errors for all bad scan paths are determined, Method 600 proceeds to step 660. In step 660, method 600 ends.

CONCLUSION

Exemplary embodiments of the present invention have been presented. The invention is not limited to these examples. These examples are presented herein for purposes of illustration, and not limitation. Alternatives (including equivalents, extensions, variations, deviations, etc., of those described herein) will be apparent to persons skilled in the relevant art(s) based on the teachings contained herein. Such alternatives fall within the scope and spirit of the invention.

What is claimed is:

1. In scan testing of an integrated circuit with a plurality of scan paths, a method for debugging scan testing failures of the integrated circuit, comprising the steps of:
   (a) conducting scan tests on the plurality of scan paths;
   (b) identifying a bad scan path that is generating one or more errors within the plurality of scan paths, wherein all other scan paths within the plurality of scan paths are considered to be good scan paths;
   (c) assessing test results on the bad scan path and good scan paths;
   (d) masking the bad scan path to define a segment point that segments the bad scan path into two segments;
   (e) tracing the source of errors in the bad scan path segment following the segment point when the number of errors of an output of the bad scan path following the segment point are less than a bad path error threshold and the number of errors of outputs on each of the good scan paths are less than a good path error threshold; and
   (f) shifting the segment point based on an analysis of the errors generated by the bad scan path and the good scan paths and returning to step (d) when the number of errors of an output of the bad scan path are greater than a bad path error threshold or the number of errors on an output of the bad scan path do not exceed the bad scan path error threshold and the number of errors on an output of any of the good scan paths is greater than a good scan path error threshold.

2. The method of claim 1, further comprising the step of confirming after step (a) that good scan paths are not generating errors.

3. The method of claim 2, further comprising masking the bad scan path.

4. The method of claim 1, wherein step (a) includes running a series of scan tests on the plurality of scan paths.

5. The method of claim 1, wherein step (a) includes running a series of scan tests for the plurality of scan paths while varying a temperature of the integrated circuit.

6. The method of claim 1, wherein step (a) includes running a series of scan tests for the plurality of scan paths while varying a test voltage.

7. The method of claim 1, wherein step (a) includes running a series of scan tests for the plurality of scan paths while varying the frequency of a clock signal input.

8. The method of claim 1, wherein step (d) includes determining the number of errors generated by the bad scan path following the segment point and each of the good scan paths.

9. The method of claim 8, wherein the tracing the source of errors is conducted manually.

10. The method of claim 8, wherein the tracing the source of errors is conducted automatically through an automated testing unit.

11. The method of claim 1, wherein in step (e) tracing the source of errors includes identifying a first error source that generated an error and determining whether the error originated within the first error source or within a coupled error source based on the relationship between the first error source and the coupled error source.

12. The method of claim 1, wherein in step (f) when the number of errors in an output of the bad scan path following the segment point is greater than the bad scan path error threshold, shifting the segment point toward the end of the bad scan path.

13. The method of claim 12, wherein the segment point is shifted such that the new segment point is midway between the end of the bad scan path and an existing segment point.

14. The method of claim 1, wherein in step (f) when the number of errors in an output of the bad scan path following the segment point is less than the bad scan path error threshold and the number of errors in an output of at least one good scan path is greater than the good scan path error threshold, shifting the segment point toward the beginning of the bad scan path.

15. The method of claim 14, wherein the segment point is shifted such that the new segment point is midway between the beginning of the bad scan path and an existing segment point.

16. In scan testing of an integrated circuit with a plurality of scan paths, a method for debugging scan testing failures of the integrated circuit, comprising the steps of:
 (a) conducting scan tests on the plurality of scan paths;
 (b) identifying a plurality of bad san paths that are generating one or more errors within the plurality of scan paths, Wherein all other scan paths within the plurality of scan paths are considered to be good scan paths;
 (c) assessing scan test results on the bad scan paths under test and good scan paths;
 (d) masking all bad scan paths except a bad scan path under test, which had not been through steps (e) through (g);
 (e) masking the bad scan path to define a segment point that segments the bad scan path into two segments;
 (f) tracing the source of errors in the bad scan path segment following the segment point when the number of errors of an output of the bad scan path following the segment point are less than a bad path error threshold and the number of errors of outputs on each of the good scan paths are less than a good path error threshold;
 (g) shifting the segment point based on an analysis of the errors generated by the bad scan path and the good scan paths and returning to step (e) when the number of errors of an output of the path scan path under test are greater than a bad path error threshold or the number of errors on an output of the bad scan path do not exceed the bad scan path error threshold and the number of errors on an output of any one of the good scan paths are greater than a good scan path error threshold; and
 (h) repeating steps (d) through (g) until the source or sources of errors within all the bad scan paths among said plurality of bad scan paths have been located.

17. The method of claim 16, further comprising the step of confirming after step (a) that good scan paths are not generating errors.

18. The method of claim 17, further comprising masking all bad scan paths.

19. The method of claim 16, wherein step (a) includes running a series of scan tests on the plurality of scan paths.

20. The method of claim 16, wherein in step (f) tracing the source of errors includes identifying a first error source that generated an error and determining whether the error originated within the first error source or within a coupled error source based on the relationship between the first error source and the coupled error source.

21. The method of claim 20, wherein tracing the source of errors is conducted manually.

22. The method of claim 20, wherein tracing the source of errors is conducted automatically through an automated testing unit.

23. The method of claim 16, wherein in step (g) when the number of errors in an output of the bad scan path following the segment point is greater than the bad scan path error threshold, shifting the segment point toward the end of the bad scan path under test.

24. The method of claim 23, wherein the segment point is shifted such that the new segment point is midway between the end of the bad scan path under test and an existing segment point.

25. The method of claim 16, wherein in step (g) when the number of errors in an output of the bad scan path following the segment point is less than the bad scan path error threshold and the number of errors in an output of at least one good scan path is greater than the good scan path error threshold, shifting the segment point toward the beginning of the bad scan path under test.

26. The method of claim 25, wherein the segment point is shifted such that the new segment point is midway between the beginning of the bad scan path under test and an existing segment point.

* * * * *

UNITED STATES PATENT AND TRADEMARK OFFICE
CERTIFICATE OF CORRECTION

PATENT NO. : 7,395,468 B2
APPLICATION NO. : 10/806093
DATED : July 1, 2008
INVENTOR(S) : Amar Guettaf It is certified that error appears in the above-identified patent and that said Letters Patent is hereby corrected as shown below:

Column 11, line 17, "bad san paths" should be replaced with --bad scan paths--.

Column 11, line 19, "Wherein" should be replaced with --wherein--.

Column 11, line 38, "the path scan path" should be replaced with --the bad scan path--.

Signed and Sealed this

Second Day of December, 2008

JON W. DUDAS
*Director of the United States Patent and Trademark Office*